(12) United States Patent
Poutasse et al.

(10) Patent No.: US 6,299,721 B1
(45) Date of Patent: Oct. 9, 2001

(54) COATINGS FOR IMPROVED RESIN DUST RESISTANCE

(75) Inventors: Charles A. Poutasse, Beachwood; Michael A. Centanni, Parma, both of OH (US)

(73) Assignee: Gould Electronics Incl, Eastlake, OH (US)

(*) Notice: Subject to any disclaimer, the term of this patent is extended or adjusted under 35 U.S.C. 154(b) by 0 days.

(21) Appl. No.: 09/211,283

(22) Filed: Dec. 14, 1998

(51) Int. Cl.$^7$ ................................................ B32B 31/00
(52) U.S. Cl. ................ 156/278; 106/287.14; 106/287.21; 156/280; 156/326; 427/156; 427/388.5
(58) Field of Search .................................... 156/278, 280, 156/326; 427/156, 388.5; 106/287.14, 287.21

(56) References Cited

U.S. PATENT DOCUMENTS

| | | |
|---|---|---|
| 5,338,619 | 8/1994 | Fukuda et al. . |
| 5,567,534 | 10/1996 | Yano et al. . |
| 5,605,958 * | 2/1997 | Yoneda et al. .................. 106/287.14 |
| 5,700,362 | 12/1997 | Yano et al. . |
| 5,962,113 | 10/1999 | Brown et al. . |
| 5,976,702 * | 11/1999 | Yoneda et al. .................. 106/287.14 |

FOREIGN PATENT DOCUMENTS

| | | |
|---|---|---|
| 700238 | 6/1996 | (EP) . |
| 716164 | 6/1996 | (EP) . |
| 2288992 | 11/1995 | (GB) . |
| 1-149866 * | 6/1989 | (JP) .................. 106/287.14 |
| 6-053651 | 2/1994 | (JP) . |
| 6-085417 | 3/1994 | (JP) . |
| 6-085455 | 3/1994 | (JP) . |
| 6-177536 | 6/1994 | (JP) . |
| 7-258870 | 10/1995 | (JP) . |
| 7-309846 | 11/1995 | (JP) . |
| 8-088461 | 2/1996 | (JP) . |
| 7-278883 | 10/1996 | (JP) . |
| 10-135202 | 4/1998 | (JP) . |
| 1142526 * | 2/1985 | (SU) .................. 106/287.14 |
| 9625838 | 8/1996 | (WO) . |

OTHER PUBLICATIONS

Appelt et al, "Improving Adhesion Between Metal Surfaces and Polymers," IBM TDB, vol. 25 No. 6, 11–1982 (156/326).*

Japanese Patent Office Official Action, Application No. 11–338706, dated Mar. 21, 2001.

* cited by examiner

Primary Examiner—John J. Gallagher
(74) Attorney, Agent, or Firm—Michael A. Centanni, Esq.

(57) ABSTRACT

In one embodiment, the present invention relates to a method of increasing resin dust resistance of metal foil comprising contacting the metal foil with an inert silane, titanate or zirconate compound to form a resin dust resistant film having a thickness from about 0.001 microns to about 1 micron on a surface of the metal foil. In another embodiment, the present invention relates to a method of treating metal foil comprising contacting a first side of the metal foil with a hydrocarbylsilane solution to form a resin dust resistant film on a surface of the metal foil, the hydrocarbylsilane solution comprising from about 0.01% to about 10% v/v of a hydrocarbylsilane; and laminating a second side of the metal foil to a prepreg.

21 Claims, No Drawings

COATINGS FOR IMPROVED RESIN DUST RESISTANCE

TECHNICAL FIELD

The present invention relates to a method for treating metal foil to retain a clean metal foil surface. In particular, the present invention relates to a method for treating metal foil with an inert silane, titanate or zirconate compound to improve its resistance to resin dust.

BACKGROUND OF THE INVENTION

Copper clad laminates are the basic component of the printed circuit boards used in the electronics industry. In the most common processes, a copper foil is bonded to a prepreg of resin, such as epoxy resin, impregnated fiberglass by heat and pressure. The copper foil surface that is pressed against the prepreg is typically an uneven or profiled surface with some kind of additional bonding treatment applied to insure that the laminate remains together under normal processing conditions.

The opposing foil surface (the surface not bonded to the prepreg) is typically a smooth surface with various treatments that are aimed at preventing oxidation of the foil and allowing solder wettability and adequate photoresist adhesion. The opposing foil surface is often scrubbed to remove various debris prior to applying the photoresist. In particular, resin dust formed during the handling of the prepreg during lay-up of the laminate has a tendency to land on the shiny surface of the copper foil to which it may become undesirably bonded during the lamination cycle. In fact, any organic material may become undesirably bonded to metal foil during the lamination cycle. If these resin dust spots are not removed prior to etching the laminate when producing a pattern of lines and spaces of copper, then the resin spots shield portions of the copper from the etching solution and prevent its complete removal. As a result, forming fine metal lines with laminates contaminated with resin dust is difficult. If a resin dust spot is large enough and in the wrong location, it provides an unintended bridge between copper lines that would cause a short in the subsequently formed circuits and render the board useless. Etching copper clad laminates with resin dust spots, especially epoxy resin dust spots, is thus problematic.

Recently two types of metal foil are available where scrubbing of the exposed laminate surface is not practical. The first type is double treat foil for multilayer boards, where both sides of the copper foil are given an additional bonding treatment because after the first lamination, another prepreg is placed against the opposing foil surface and pressed to form a prepreg-foil-prepreg "sandwich." Any scrubbing of this surface would damage the bonding treatment and render it less capable of forming a strong bond to the second prepreg.

The second type of metal foil is reverse treat foil, where the bonding treatment is applied only to the smooth side of the foil that, in turn, is laminated to the prepreg, leaving the uneven or matte surface exposed to the resin dust. Scrubbing of this surface is an undesirable process that reduces some of the profile desired for photoresist attachment and future processing. Scrubbing certain metal foil surfaces is disfavored.

SUMMARY OF THE INVENTION

In one embodiment, the present invention relates to a method of increasing resin dust resistance of metal foil comprising contacting the metal foil with an inert silane, titanate or zirconate compound to form a resin dust resistant film having a thickness from about 0.001 microns to about 1 micron on a surface of the metal foil.

In another embodiment, the present invention relates to a method of treating metal foil comprising contacting a first side of the metal foil with a hydrocarbylsilane solution to form a resin dust resistant film on a surface of the metal foil, the hydrocarbylsilane solution comprising from about 0.01% to about 10% v/v of a hydrocarbylsilane; and laminating a second side of the metal foil to a prepreg.

In yet another embodiment, the present invention relates to a method of treating copper foil comprising contacting the copper foil with a solution comprising from about 0.05% to about 5% v/v of an alkylsilane and from about 0.1 g/l to about 10 g/l of a triazole compound; and laminating the metal foil to a resin material.

As a result of the present invention, it is possible to provide metal foil which exhibits high resin dust resistance. In particular, the present invention provides a coating for application to a metal foil surface that prevents resin dust from sticking and/or accumulating to the exposed side of metal foil which is not adjacent a prepreg. Thus, a clean metal foil surface after lamination without scrubbing is obtainable due to the present invention. It is also possible to maintain a clean metal foil surface after lamination without scrubbing or cleaning.

DESCRIPTION OF THE INVENTION

The present invention involves treating metal foil by contacting the surface of a metal foil with an inert silane, titanate or zirconate compound to impart resin dust resistance to the metal foil. In other words, metal foil is treated by contacting the surface of a metal foil with an inert silane, titanate or zirconate compound to impart reduced resin dust adhesion to the metal foil. The silane compounds are preferred. Typically, the exposed side of metal foil is treated (the side not adjacent the prepreg). Resin dust includes various debris, particulates and other small particles which are released or emanate from the use, storage, transfer, wear and/or tear of resin articles, such as resin based dielectric materials and prepregs. Resin dust typically comes from organic materials such as epoxy resin materials, polyimide resin materials, and polyester resin materials. Resin dust from epoxy resin materials is particularly troublesome. Treating metal foil by contacting the surface of a metal foil with an inert silane, titanate or zirconate compound in accordance with the present invention forms a dust resistant film on the metal foil surface.

The metal foil treated in accordance with the present invention is any metal foil that may be laminated with a resin based material, such as an epoxy prepreg. The metal foil treated in accordance with the present invention is preferably an electrically conductive foil with copper and copper-based alloy foils being especially preferred. Other examples include aluminum, nickel, tin, silver, gold and alloys thereof. The metal foils are made in any suitable manner. Typically, the metal foils are made using one of two techniques. Wrought or rolled metal foil, such as copper foil, is produced by mechanically reducing the thickness of a metal or metal alloy strip or ingot by a process such as rolling. Electrode-posited foil is produced by electrolytically depositing metal ions, such as copper ions, on a rotating cathode drum and then peeling the deposited strip from the cathode. Electrode-posited copper foils are especially preferred.

The metal foils typically have nominal thicknesses ranging from about 0.0002 inch to about 0.2 inch. Metal foil thickness is sometimes expressed in terms weight and typically the foils of the present invention have weights or thicknesses ranging from, for example, about 1/8 to about 14 oz/ft². Especially useful metal foils are those having weights of ½, 1 or 2 oz/ft², and in particular, copper foil having weights of ½, 1 or 2 oz/ft².

Electrodeposited metal foils have a smooth or shiny (drum) side and a rough or matte (metal deposit growth front) side. The side or sides of the metal foil (electrodeposited or wrought) which may be contacted with an inert silane, titanate or zirconate in accordance with the invention can be the rough or matte side, shiny side, or both sides (standard treated foil, reverse treated foil and double treated foil). Standard treated metal foil has its matte side treated, reverse treated metal foil has its shiny side treated, and double treated metal foil has both matte and shiny sides treated.

The sides may be a "standard-profile surface," "low-profile surface" or "very-low-profile surface." Especially preferred embodiments involve the use of foils with matte surfaces and standard-profile surfaces. The term "standard-profile surface" is used herein to refer to a foil surface having an $R_{tm}$ of about 7 microns to about 12 microns. The term "low-profile surface" refers to a foil surface having an $R_{tm}$ of about 7 microns or less. The term "very-low-profile surface" refers to a foil surface having an $R_{tm}$ of about 4 microns or less. $R_{tm}$ is the mean of the maximum peak-to-valley vertical measurement from each of five consecutive sampling measurements, and can be measured using a Surtronic 3 profilometer marketed by Rank Taylor Hobson, Ltd., Leicester, England.

In one embodiment, the metal foils of the present invention may be characterized by the absence of any added metal layer containing zinc. This includes layers of zinc as well as layers of metal alloys containing zinc. In a few instances, zinc deleteriously interferes with the inert silane resulting in a treated metal foil having poor properties.

In one embodiment, the metal foils of the present invention may be characterized by the absence or presence of any added surface roughening treatment on the base surface of the side or sides on which the inventive method is practiced. The term "base surface" of a side of foil refers to a raw foil surface which has not been subjected to any subsequent treatments of the type discussed below for refining or enhancing foil properties and/or increasing surface roughness. The term "added surface roughening" refers to any treatment performed on the base surface of the foil for the purpose of increasing the roughness of the surface of the foil not in accordance with the inventive method. In one embodiment, added surface roughening increases the $R_{tm}$ by 3 microns or more; and in another embodiment, added surface roughening increases the $R_{tm}$ by 10 microns or more.

In one embodiment, mechanical roughness imparted to wrought metal foil during rolling or by subsequent abrasion which increases roughness beyond that of a standard profile surface is considered to be an added surface roughening treatment. In one embodiment, roughness imparted to an electrodeposited metal foil during electrodeposition which increases roughness beyond that of a standard profile surface is considered to be an added surface roughening. In one embodiment, any roughness imparted to the base surface of a metal foil that increases the roughness of said foil beyond that of a standard profile surface is considered to be added surface roughening. In one embodiment, any roughness imparted to the base surface of a metal foil that increases the roughness of said foil beyond that of a low-profile surface is considered to be added surface roughening. In one embodiment, any roughness imparted to the base surface of a metal foil that increases the roughness of said foil beyond that of a very low-profile surface is considered to be added surface roughening.

In one embodiment, the base surface of the side or sides of the metal foil is untreated prior to being subjected to the inventive method. The term "untreated" is used herein to refer to the base surface of a metal foil that has not undergone subsequent treatment for the purpose of refining or enhancing the foil properties and/or increasing surface roughness. In one embodiment, the untreated foils have a naturally occurring, non-dendritic or non-nodular layer of a metal oxide adhered to the base surface thereof. This naturally occurring oxide layer is not an added treatment provided for refining or enhancing foil properties and/or increasing surface roughness.

In one embodiment, the base surface of the side or sides of the foil is treated, prior to being subjected to the inventive method, with one or more surface treatment layers for the purpose of refining or enhancing the foil properties, but not to add surface roughness. Any side of the foil which is not subjected to the inventive method can, optionally, also have one or more of such treatment layers applied to it. These surface treatments are known in the art.

For example, the surface treatments include the application of a metal layer which does not increase the surface roughness wherein the metal is indium, tin, nickel, cobalt, copper alloy such as copper-tin alloy, and mixtures of two or more thereof, prior to practicing the inventive method. Metal layers of this type are sometimes referred to as barrier layers. These metal layers preferably have thicknesses in the range of about 0.01 to about 1 micron, more preferably about 0.05 to about 0.1 micron.

The surface treatments also include the application of a metal layer which does not increase the surface roughness wherein the metal is tin, nickel, molybdenum, chromium, chromium-zinc, aluminum, or a mixture of two or more thereof, prior to practicing the inventive method. Metal layers of this type are sometimes referred to as stabilization layers. These stabilization layers can be applied to the base surface of the foil, or they can be applied to a previously applied barrier layer. These stabilization layers preferably have thicknesses in the range of about 0.005 to about 0.05 micron, more preferably about 0.01 to about 0.02 micron.

In one embodiment, one or both sides of the foil are first treated with at least one barrier layer. In another embodiment, one or both sides of the foil are first treated with at least one stabilization layer. In yet another embodiment, one or both sides of the foil are first treated with at least one barrier layer, then at least one of the treated sides is treated with at least one stabilization layer prior to practicing the inventive method.

The metal foil in accordance with this invention can be a single layer metal foil, such as a copper foil, an aluminum foil or a nickel foil, or a foil of a metal alloy. The metal foil in accordance with this invention can be a foil containing multiple layers of a metal or metal alloy, such as a foil made of layers of copper and brass. There is no particular limit to the number of metal layers in any given metal foil.

The inventive method involves contacting the surface of a metal foil, opposite the surface of which is or will be laminated to a resin material, such as an epoxy prepreg, with an inert silane, titanate or zirconate compound. In one embodiment, the surface of a metal foil is treated in accordance with the present invention prior to lamination to a resin material. In another embodiment, the surface of a metal foil is treated in accordance with the present invention after lamination to a resin material.

In one embodiment, the inventive process optionally involves initially contacting the metal foil with an acidic solution. An acidic solution has a pH of less than about 5, and preferably less than about 3, and more preferably less than about 2. The acidic solution contains an acid and a solvent such as water, polar organic liquids such as alcohols and glycols, and mixtures thereof. Contacting the metal foil with the acidic solution serves to remove surface oxides from the metal foil and otherwise clean the surface of the metal foil. Additionally, in some instances, contact with the acidic solution before application of the inert silane, titanate or zirconate compound facilitates the inventive treatment.

The metal foil is contacted with the acidic solution in any suitable manner including but not limited to dipping, spraying, wiping, immersing and the like. In a preferred embodiment, the metal foil is immersed in the acidic solution. In another preferred embodiment, the temperature of the acidic solution is from about 20° C. to about 60° C., and more preferably from about 30° C. to about 40° C.

The acidic solution contains an acid and a suitable solvent, which is typically water, although polar organic liquids can be used, or combinations of water and polar organics. Either inorganic or organic acids can be used, but inorganic acids are preferred. Specific examples of inorganic acids which may be utilized in the acidic solution include halogen acids such as hydrofluoric acid, hydrochloric acid, hydrobromic acid and hydriodic acid, sulfuric acid, sulfurous acid, nitric acid, perchloric acid, boric acid and phosphorus acids such as phosphorous acid and phosphoric acid, and combinations thereof. Nitric acid and sulfuric acid are preferred inorganic acids. Examples of organic acids include carboxylic and polycarboxylic acids such as formic acid, acetic acid, propionic acid, citric acid, oxalic acid, etc.; organic phosphorus acids such as dimethylphosphoric acid and dimethylphosphinic acid; or sulfonic acids such as methanesulfonic acid, ethanesulfonic acid, 1-pentanesulfonic acid, 1-hexanesulfonic acid, 1-heptanesulfonic acid, benzenesulfonic acid, toluenesulfonic acid, etc, and combinations thereof.

In a preferred embodiment, after the metal foil has contacted the acidic solution, the metal foil is optionally rinsed with a neutral solution, and in most instances water, and preferably deionized water. The neutralizing or rinsing solution serves to remove excess acid from the surface of the metal foil in addition to neutralizing the surface of the metal foil.

The metal foil is contacted with an inert silane, titanate or zirconate compound, typically via an inert silane, titanate or zirconate compound solution. Alternatively, an inert silane, titanate or zirconate compound can be applied directly to the metal foil surface.

The inert silane compounds include hydrocarbylsilanes, fluorocarbonsilanes and other silane compounds that bond to the metal foil and do not react with the resin dust. The titanate and zirconate compounds typically have large (eg., about 5 to about 20 carbon atoms) hydrocarbyl or substantially hydrocarbyl groups attached to a central titanium or zirconium atom. These silane, titanate and zirconate compounds typically contain about 5 to about 100 carbon atoms, and in one embodiment about 20 to about 60 carbon atoms.

The term "hydrocarbyl" includes hydrocarbon as well as substantially hydrocarbon groups. Substantially hydrocarbon describes groups which contain heteroatom substituents which do not alter the predominantly hydrocarbon nature of the group. Examples of hydrocarbyl groups include the following: (1) hydrocarbon substituents, i.e., aliphatic (e.g., alkyl or alkenyl), alicyclic (e.g., cycloalkyl, cycloalkenyl) substituents, aromatic-, aliphatic- and alicyclic-substituted aromatic substituents and the like as well as cyclic substituents wherein the ring is completed through another portion of the molecule (that is, for example, any two indicated substituents may together form an alicyclic radical); (2) substituted hydrocarbon substituents, i.e., those substituents containing non-hydrocarbon groups which, in the context of this invention, do not alter the predominantly hydrocarbon nature of the substituent; those skilled in the art will be aware of such groups (e.g., fluoro, etc.); and (3) heteroatom substituents, i.e., substituents which, while having a predominantly hydrocarbon character within the context of this invention, contain an atom other than carbon present in a ring or chain otherwise composed of carbon atoms (e.g., alkoxy). In general, no more than about 2, preferably no more than one, hetero substituent are present for every ten carbon atoms in the hydrocarbyl group. Typically, there are no such hetero atom substituents in the hydrocarbyl group. Therefore, the hydrocarbyl group is purely hydrocarbon. In a preferred embodiment, the hydrocarbyl group is an alkyl group, a cyclic alkyl group, or an aromatic group.

General examples of inert silane compounds include alkylsilanes, cycloalkylsilanes, aromatic silanes, substituted aromatic silanes, and fluorocarbonsilanes. In one embodiment, the inert silane compound may be represented by the formula

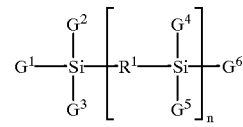

wherein $G^1$, $G^2$, $G^3$, $G^4$, $G^5$ and $G^6$ are independently hydrocarbyl, or hydrocar-byloxy groups; $R^1$ is a hydrocarbyl group; and n is zero or 1. In one embodiment each of $G^1$, $G^2$, $G^3$, $G^4$, $G^5$ and $G^6$ is independently alkoxy, and $R^1$ is an alkylene or an arene group of up to about 10 carbon atoms, or an arene group of up to about 10 carbon atoms. In one embodiment each of $G^1$, $G^2$, $G^3$ and $G^6$ is an alkoxy group of up to about 10 carbon atoms, and n is zero. Examples of these inert silane compounds include 1,2-bis(trimethoxysilyl)ethane, bis(trimeth-oxysilylethyl)benzene, and 1,6-bis(trimethoxysilyl)hexane.

In another embodiment, the inert silane compound may be a compound represented by the formula

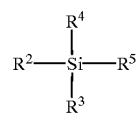

wherein $R^2$, $R^3$, $R^4$ and $R^5$ are independently hydrogen, a hydrocarbyl group, a fluorocarbon group, a hydrocarbyloxy group, or a hydroxy group. In one embodiment, each of $R^3$, $R^4$ and $R^5$ are methoxy or ethoxy, and R2 is a hydrocarbyl group or a fluorocarbon group. In one embodiment, each of $R^4$ and $R^5$ are methoxy or ethoxy, and $R^2$ and $R^3$ are hydrocarbyl groups.

Examples of these inert silane compounds include methyltrimethoxysilane; ethyltrimethoxysilane; propyltrimethoxysilane; n-butyltrimethoxysilane; isobutyltrimethoxysilane; pentyltrimethoxysilane; hexyltrimethoxysilane; octyltrimethoxysilane; 7-oct-1-enyltrimethoxysilane; phenyltrimethoxysilane; hydrocarbyl substituted phenyltrimethoxysilanes such as p-(methyl)phenyltrimethoxysilane; 3-cyclopentadienylpropyltrimethoxysilane; vinyltrimethoxysilane; allyltrimethoxysilane; methoxypropyltrimethoxysilane; methyltriethoxysilane; ethyltriethoxysilane; propyltriethoxysilane; n-butyltriethoxysilane; isobutyltriethoxysilane; pentyltriethoxysilane; hexyltriethoxysilane; octyltriethoxysilane; 7-oct-1-enyltriethoxysilane; phenyltriethoxysilane; hydrocarbyl substituted phenyltriethoxysilanes such as (methyl)phenyltriethoxysilane; 3-cyclopentadienylpropyltriethoxysilane; vinyltriethoxysilane; allyltriethoxysilane; methoxypropyltriethoxysilane; methyltriisopropoxysilane; ethyltriisopropoxysilane; propyltriisopropoxysilane; vinyltriisopropoxysilane; vinyltris-t-butoxysilane; (3,3,3-trifluoropropyl)trimethoxysilane; and tridecafluoroctyl triethoxysilane.

Mixtures of two or more of the inert silane compounds listed above may be used. For example, in one embodiment, the inert silane compound is methyltrimethoxysilane or isobutyltrimethoxysilane in combination with propyltrimethoxysilane. In another embodiment, the inert silane compound is a fluorocarbonsilane in combination with an alkylsilane. In yet another embodiment, the inert silane compound is (3,3,3-trifluoropropyl)trimethoxysilane in combination with propyltrimethoxysilane.

The titanate compounds that are useful include di(cumyl) phenyl oxoethylene titanate; di(dioctyl)pyrophosphate oxoethylene titanate; isopropyl triisostearoyl titanate; isopropyl dimethacryl isostearoyl titanate; isopropyl tri(dodecyl) benzenesulfonyl titanate; isopropyl tri(dioctyl)phosphato titanate; isopropyl (4-amino)benzenesulfonyl di(dodecyl) benzenesulfonyl titanate; isopropyl tri(dioctyl) pyrophosphato titanate; tetraoctyl di(ditridecyl)phosphito titanate; tetra (2,2 diallyoxymethyl)butyl,di(ditridecyl) phosphito titanate; neopentyl (diallyl)oxy,trineodecanonyl titanate; neopentyl(diallyl)oxy,tri(dodecyl)benzene-sulfonyl titanate; neopentyl(diallyl)oxy,tri(dioctyl)phosphato titanate; neopentyl(diallyl)oxy,tri(dioctyl)pyro-phosphato titanate; and mixtures of two or more thereof. These compounds are sometimes referred to as titanate coupling agents.

The zirconate compounds that are useful include neopentyl(diallyl)oxy,tri(dioctyl)phosphato zirconate. These compounds are sometimes referred to as zirconate coupling agents.

Mixtures of two or more of the foregoing silane, titanate and/or zirconate compounds can be used.

The inert silane, titanate or zirconate compound solution may be in the form of a dispersion or solution in water, a mixture of water and alcohol, or a suitable organic solvent, or as an aqueous emulsion of the inert silane, titanate or zirconate compound, or as an aqueous emulsion of a solution of the inert silane, titanate or zirconate compound in a suitable organic solvent. Conventional organic solvents may be used. These include alcohols, ethers, ketones, and mixtures of these with aliphatic or aromatic hydrocarbons or with amides such as N,N-dimethylformamide. Useful solvents are those having good wetting and drying properties and include, for example, water, methanol, ethanol, isopropanol, and methylethylketone. Aqueous emulsions of the inert silane, titanate or zirconate compound may be formed in conventional manner using conventional dispersants and surfactants, including nonionic dispersants.

The step of contacting the metal foil with the inert silane, titanate or zirconate solution may be repeated, if desired, several times. However, a single step gives generally useful results and, hence, the use of a single step is generally preferred. Contact is accomplished via suitable application methods which include reverse roller coating, doctor blade coating, dipping, immersing, painting and spraying, although immersing the metal foil in the inert silane, titanate or zirconate solution is preferred.

In one embodiment, the inert silane, titanate or zirconate compound is present in the solution in an amount from about 0.01% to about 10% v/v. In another embodiment, the inert silane, titanate or zirconate compound is present in the solution in an amount from about 0.05% to about 5% v/v. In yet another embodiment, the inert silane, titanate or zirconate compound is present in the solution in an amount from about 0.1% to about 2% v/v.

The inert silane, titanate or zirconate compound and the inert silane, titanate or zirconate compound solution are typically at a temperature from about 10° C. to about 50° C. In another embodiment, the inert silane, titanate or zirconate compound solution is at a temperature from more about 15° C. to about 40° C. In yet another embodiment, the inert silane, titanate or zirconate compound solution is at a temperature from more about 20° C. to about 30° C. The metal foil is in contact with the inert silane, titanate or zirconate compound solution for a time sufficient for a dust resistant film to form on a surface of the metal foil. In one embodiment, the metal foil is in contact with the inert silane, titanate or zirconate compound solution from about 1 second to about 10 minutes. In another embodiment, the metal foil is in contact with the inert silane, titanate or zirconate compound solution from about 5 seconds to about 100 seconds.

After the metal foil is contacted with the inert silane, titanate or zirconate compound solution, the metal foil is permitted to dry or is optionally heated for a suitable period of time to drive off solvent and form an inert silane, titanate or zirconate compound film. In one embodiment, the metal foil is heated to a temperature from about 50° C. to about 170° C. In another embodiment, the metal foil is heated to a temperature from about 70° C. to about 150° C. The metal foil is optionally heated for about 1 second to about 5 minutes. In another embodiment, the metal foil is optionally heated for about 10 seconds to about 2 minutes.

The inventive treatment forms a resin dust resistant film on surface of the metal foil. In a preferred embodiment, the inventive treatment forms an epoxy resin dust resistant film on surface of the metal foil. The resin dust resistant film may be continuous, substantially continuous or non-continuous, so long as the film prevents resin dust from adhering, settling and/or accumulating on the treated metal foil surface. In preferred embodiments, the resin dust resistant film is continuous or at least substantially continuous over the treated metal foil surface. In one embodiment, the resin dust resistant film of the inert silane, titanate or zirconate compound on the metal foil has a thickness from about 0.001 to about 1 micron. In another embodiment, the resin dust resistant film of the inert silane, titanate or zirconate compound on the metal foil has a thickness from about 0.0025 to about 0.1 microns. In yet another embodiment, the resin dust resistant film of the inert silane, titanate or zirconate compound on the metal foil has a thickness from about 0.005 to about 0.05 microns.

The inert silane, titanate or zirconate compound solution may optionally contain certain additives. In one embodiment, the inert silane, titanate or zirconate compound solution does not contain any additives. In another embodiment, the inert silane, titanate or zirconate compound solution contains additives, such as triazole compounds. Triazole compounds include aminotriazoles, benzotriazole, hydroxybenzotriazole, alkyl substituted benzotriazoles such as methylbenzotriazole, and carboxylbenzotriazole. In one embodiment, the inert silane, titanate or zirconate compound solution contains from about 0.01 g/l to about 10 g/l of one or more of the foregoing additives. In another embodiment, the inert silane, titanate or zirconate compound solution contains from about 0.1 g/l to about 5 g/l of one or more of the foregoing additives.

In one embodiment, the inert silane, titanate or zirconate compound solution is metal free; that is, the inert silane, titanate or zirconate compound solution is characterized by the absence of added metals or metal compounds. In some instances metal compounds deleteriously affect the resultant inert silane, titanate or zirconate compound film formed. In one embodiment, after the metal foil is treated in accordance with the invention, no electrolytic step is performed. The absence of additional electrolytic steps simplifies methods of making metal foil as well as simplifying the fabrication of laminates for printed circuit boards.

In one embodiment, after the metal foil has contacted the inert silane, titanate or zirconate compound, the metal foil is optionally rinsed with a neutral solution, and in most instances water and specifically deionized water. The neutralizing or rinsing solution serves to remove excess materials from the surface of the treated metal foil.

The metal foils treated in accordance with the present invention can be bonded to dielectric substrates to provide dimensional and structural stability thereto. With the inventive foils, either the matte side or shiny side can be effectively bonded to a dielectric substrate, but the side of the foil treated in accordance with the present invention is not initially bonded to a dielectric substrate (however, in the case of double treated foil, both sides are eventually bonded to dielectric substrates).

Useful dielectric substrates may be prepared by impregnating woven glass reinforcement materials with partially cured epoxy resins (e.g., difunctional, tetrafunctional and multifunctional epoxies), polyimide resins, or polyester resins. These dielectric substrates are sometimes referred to as prepregs, such as epoxy prepregs.

In preparing the laminates, it is useful for both the prepreg material and the metal foil to be provided in the form of long webs of material rolled up in rolls. In one embodiment these long webs of metal foil and prepreg are laminated using a continuous process. In this process a continuous web of the treated metal foil often with an adhesion promoting layer adhered thereto is brought into contact with a continuous web of prepreg material under laminating conditions to form a laminate structure. This laminate structure is then cut into rectangular sheets and the rectangular sheets are then laid-up or assembled in stacks of assemblages.

In one embodiment the long webs of treated metal foil and prepreg material are first cut into rectangular sheets and then subjected to lamination. In this process rectangular sheets of the treated metal foil and rectangular sheets of the prepreg material are then laid-up or assembled in stacks of assemblages.

Each assemblage may comprise a prepreg sheet with a sheet of treated metal foil on either side thereof, and in each instance, the adhesion bonding treated side (or one of the sides) of the metal foil is positioned adjacent the prepreg. The side of the metal foil processed in accordance with the present invention is facing away from the prepreg. The assemblage may be subjected to conventional laminating temperatures and pressures between the plates of laminating presses to prepare laminates comprising sandwiches of a sheet of prepreg between sheets of treated metal foil.

The prepregs may consist of a woven glass reinforcement fabric impregnated with a resin, such as a partially cured two-stage resin in embodiments where an epoxy resin is employed. By application of heat and pressure, the untreated (in accordance with the present invention) side of the copper foil is pressed tightly against the prepreg and the temperature to which the assemblage is subjected activates the resin to cause curing, that is crosslinking of the resin and thus tight bonding of the foil to the prepreg dielectric substrate. Generally speaking, the laminating operation will involve pressures in the range of from about 100 to about 1,000 psi, temperatures in the range of from about 150° C. to 250° C. and a laminating cycle of from about 30 minutes to about 3 hours. The finished laminate may then be utilized to prepare printed circuit boards (PCB). In one embodiment, the inert silane, titanate or zirconate compound is removed from the copper surface after lamination.

In one embodiment, the laminate is subjected to a subtractive copper etching process to form electrically conductive lines or an electrically conductive pattern as part of a process for making a multilayered circuit board. The inert silane, titanate or zirconate treatment is next removed from the patterned metal. A second bonding treatment is then conducted over the etched pattern using the techniques discussed above and then a second prepreg is adhered to the etched pattern. The etched pattern exhibits good dimensional control since resin dust does not effect the etching process. The techniques for making multilayered circuit boards are well known in the art.

A number of manufacturing methods are available for preparing PCBs from laminates. Additionally, there is a myriad of possible end use applications including radios, televisions, computers, etc., for the PCB's. These methods and end uses are known in the art.

One advantage resulting from the present invention is that the treated metal foils obtainable in accordance with the invention exhibit high resin dust resistance when used in connection with prepregs. This is because the inventive method permits the treated metal foil to maintain a resin dust barrier during processing of the treated metal foil. Another advantage is that the treated metal foil exhibits excellent patternability when etching the foil.

In embodiments where double treated foil is treated in accordance with the present invention, or where it is desirable to remove the resin dust resistant film, the treated metal foil is contacted with a dilute aqueous or organic acid or base solution.

While not wishing to be bound by any theory, it is believed that the individual inert silane, titanate or zirconate compound molecules are positioned on the surface of the metal foil so that the alkoxy end is adjacent the metal foil surface while the nonpolar substituent (hydrocarbyl or fluorocarbon end) is positioned away from the metal foil surface. The nonpolar substituent is believed to at least one of repel resin dust, prevent resin dust from settling on the metal foil surface, prevent resin dust from binding or strongly binding on the metal foil surface, and prevent resin dust from accumulating on the metal foil surface.

While not intending to be so limiting, the following examples illustrate various and novel aspects of the present invention. Unless otherwise indicated, in the following examples as well as throughout the specification and claims, all parts and percentages are by weight, all temperatures are in degrees centigrade, and all pressures are atmospheric.

EXAMPLES 1

Nine silane solutions (6 inert silane compound solutions and 3 comparative silane solutions) are prepared containing about 1% v/v of the subject silane compound, water, and ethanol as needed to dissolve the silane compounds. The silane compounds are applied to the matte side of a drum side treated copper foil by dipping with a dwell time of about 20 seconds, then drying for about 1 minute at about 100° C. The coated copper foils (matte side) were then laminated to epoxy prepreg layers (either a 1 oz/ft² copper foil to a Polyclad ATS 140° C. $T_g$ epoxy prepreg or a 1 oz/ft² copper foil to a General Electric TS epoxy prepreg). The control does not have any silane compound thereon. The coated foils are laminated to an epoxy prepreg at 250 psi pressure, heated to 177° C., and held together for about 1 hour, followed by cooling to room temperature. All of the laminates are imaged and etched to give a pattern of lines, all 0.125 inches wide.

The lines are peeled halfway down to provide an initial peel strength as in the After Thermal Stress section of 2.4.8 of the IPC Test Methods Manual. The lower the peel strength, the higher the epoxy resin dust resistance. Table 1 reports the peel strengths in pounds per inch. Peel strengths associated with the inert silanes is notably lower than the peel strengths associated with the comparative silanes. The silane compounds are trimethoxysilanes with the fourth silicon substituent specified in Table 1.

TABLE 1

| Silane | PCL ATS | GE TS |
| --- | --- | --- |
| control | 0.9 | 1.5 |
| methyl | 0.5 | 1.2 |
| propyl | 0.2 | 0.6 |
| isobutyl | 0.6 | 0.6 |
| octyl | 0.7 | 1.1 |
| trifluoropropyl | 0.6 | 1.3 |
| phenyl | 0.8 | 1.2 |
| aminopropyl | 3.7 | 5.4 |
| bromopropyl | 3.0 | 4.6 |
| glycidoxypropyl | 3.6 | 6.7 |

A method of evaluating the effectiveness of the inventive resin dust resistant film is to coat a piece of foil on the desired side with one of the silane, titanate or zirconate compounds of the invention. The foil is then laid over a stack of the appropriate number of a selected type of prepreg with the desired side up. A selected number of resin dust particles is placed on the foil surface and a similar set up made with an identical foil that lacks the inventive resin dust resistant film. Then steel plates are placed on top of the foils and lamination proceeds as above. After lamination, the steel plates are removed and the number of resin dust particles on both foils and both steel plates counted with the aid of a black light source. When phenyltrimethoxysilane and (3,3, 3-trifluoro propyl) trimethoxysilane are separately evaluated by this method, compared to a foil that has no silane compound, fewer spots are found on the foil with the silane coating and more resin dust remains on the stainless steel plate.

While the invention has been explained in relation to its preferred embodiments, it is to be understood that various methods thereof will become apparent to those skilled in the art upon reading this specification. Therefore, it is to be understood that the invention disclosed herein is intended to cover such modifications falling within the scope of the appended claims.

What is claimed is:

1. A method of treating metal foil comprising:
   contacting a first side of the metal foil with a hydrocarbylsilane solution to form a resin dust resistant film on a surface of the metal foil, the hydrocarbylsilane solution comprising from about 0.01% to about 10% v/v of a hydrocarbylsilane; and
   laminating a second side of the metal foil to a prepreg, wherein the hydrocarbylsilane solution further comprises water and an organic solvent and a triazole compound.

2. The method of claim 1, wherein the metal foil has a matte surface and a shiny surface, and the resin dust resistant film is formed on the matte surface.

3. The method of claim 1, wherein the metal foil has a matte surface and a shiny surface, and the resin dust resistant film is formed on the shiny surface.

4. The method of claim 1, wherein the hydrocarbyl silane compound comprises at least one of methyltrimethoxysilane; ethyltrimethoxysilane; propyltrimethoxysilane; n-butyltrimethoxysilane; isobutyltrimethoxysilane; pentyltrimethoxysilane; hexyltrimethoxysilane; octyltrimethoxysilane; 7-oct-1-enyltrimethoxysilane; phenyltrimethoxysilane; hydrocarbyl substituted phenyltrimethoxysilanes such as p-(methyl)phenyltrimethoxysilane; 3-cyclopentadienylpropyltrimethoxysilane; vinyltrimethoxysilane; allyltrimethoxysilane; methoxypropyltrimethoxysilane; methyltriethoxysilane; ethyltriethoxysilane; propyltriethoxysilane; n-butyltriethoxysilane; isobutyltriethoxysilane; pentyltriethoxysilane; hexyltriethoxysilane; octyltriethoxysilane; 7-oct-1-enyltriethoxysilane; phenyltriethoxysilane; hydrocarbyl substituted phenyltriethoxysilanes such as p-(methyl)phenyltriethoxysilane; 3-cyclopentadienylpropyltriethoxysilane; vinyltriethoxysilane; allyltriethoxysilane; methoxypropyltriethoxysilane; methyltriisopropoxysilane; ethyltriisopropoxysilane; propyltriisopropoxysilane; vinyltriisopropoxysilane; vinyltris-t-butoxysilane; (3,3,3-trifluoropropyl)trimethoxysilane; and tridecafluoroctyl triethoxysilane.

5. The method of claim 1, wherein the hydrocarbylsilane solution comprises at least one alkylsilane.

6. The method of claim 1, wherein the hydrocarbylsilane comprises at least two hydrocarbylsilane compounds.

7. The method of claim 1, wherein the hydrocarbylsilane solution further comprises a fluorocarbonsilane.

8. The method of claim 1, further comprising contacting the metal foil with an acidic solution and optionally rinsing the metal foil prior to contact with the hydrocarbylsilane solution.

9. The method of claim 1, wherein the hydrocarbylsilane solution is at a temperature from about 10° C. to about 50° C. and the metal foil is contacted with the hydrocarbylsilane solution for a period of time from about 1 second to about 10 minutes.

10. The method of claim 1, wherein the metal foil is characterized by an absence of a metal layer containing zinc.

11. The method of claim 1, wherein the prepreg comprises at least one of an epoxy resin material, a polyimide resin material and a polyester resin material.

12. The method of claim 1, wherein the metal foil is a copper or copper-based alloy foil.

13. A method of treating copper foil comprising:
   contacting a surface of the copper foil opposite a surface to be laminated to a resin material with a solution comprising from about 0.05% to about 5% v/v of an alkylsilane and from about 0.1 g/l to about 10 g/l of a triazole compound; and
   laminating the metal foil to an epoxy resin material, wherein the solution further comprises water and an organic solvent.

14. The method of claim 13, wherein the alkylsilane comprises at least one of methyltrimethoxysilane; ethyltrimethoxysilane; propyltrimethoxysilane; isobutyltrimethoxysilane; methyltriethoxysilane; ethyltriethoxysilane; propyltriethoxysilane; and isobutyltriethoxysilane.

15. The method of claim 13, wherein the triazole compound comprises at least one of an aminotriazole, a benzotriazole, a hydroxybenzotriazole, an alkyl substituted benzotriazoles and a carboxylbenzotriazole.

16. The method of claim 13, wherein the solution is at a temperature from about 15° C. to about 40° C. and the copper foil is contacted with the solution for a period of time from about 5 to about 100 seconds.

17. The method of claim 13, wherein the solution comprises at least two alkylsilane compounds.

18. The method of claim 13, wherein the solution further comprises a fluorocarbonsilane.

19. The method of claim 13, further comprising contacting the metal foil with an acidic solution and optionally rinsing the metal foil prior to contact with the solution.

20. The method of claim 13, wherein the metal foil is characterized by an absence of a metal layer containing zinc.

21. The method of claim 13, wherein the resin material comprises at least one of an epoxy resin material, a polyimide resin material and a polyester resin material.

* * * * *